United States Patent
Lovett

(10) Patent No.: US 6,750,497 B2
(45) Date of Patent: Jun. 15, 2004

(54) HIGH-SPEED TRANSPARENT REFRESH DRAM-BASED MEMORY CELL

(75) Inventor: Simon J. Lovett, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/225,423

(22) Filed: Aug. 22, 2002

(65) Prior Publication Data

US 2004/0036096 A1 Feb. 26, 2004

(51) Int. Cl.[7] .............................................. H01L 27/108
(52) U.S. Cl. ........................................ 257/296; 257/297
(58) Field of Search .................................. 257/296–310

(56) References Cited

U.S. PATENT DOCUMENTS

| | | | |
|---|---|---|---|
| 5,724,296 A | | 3/1998 | Jang |
| RE36,180 E | | 4/1999 | Lim |
| 6,262,936 B1 | | 7/2001 | Arcoleo et al. |
| 6,262,937 B1 | | 7/2001 | Arcoleo et al. |
| 6,292,403 B1 | | 9/2001 | Pancholy et al. |
| 6,317,358 B1 | | 11/2001 | Keeth |
| 6,331,961 B1 | | 12/2001 | Kengeri et al. |
| 6,385,128 B1 | | 5/2002 | Arcoleo et al. |
| 6,563,754 B1 | * | 5/2003 | Lien et al. |
| 2002/0034114 A1 | | 3/2002 | Tobita |

OTHER PUBLICATIONS

"Transparent–Refresh DRAM (TReD) Using Dual–Port DRAM Cell," by Takayasu Sakurai et al., IEEE 1988 Custom Integrated Circuits Conference, pp. 4.3.1–4.3.4.

"A High–Density Dual–Port Memory Cell Operation for ULSI DRAMs," by Hideto Hidaka et al., 1991 Symposium on VLSI Circuits, Digest of Technical Papers, May 30–Jun. 1, 1991, pp. 65 and 66.

"An 8–ns Random Cycle Embedded RAM Macro with Dual–Port Interleaved DRAM Architecture ($D^2RAM$)," by Yasuhiro Agata et al., IEEE Journal of Solid–State Circuits, vol. 35, No. 11, Nov. 2000, pp. 1668–1671.

* cited by examiner

Primary Examiner—Fetsum Abraham
(74) Attorney, Agent, or Firm—Dickstein Shapiro Morin & Oshinsky LLP

(57) ABSTRACT

A high-speed transparent refresh DRAM-based memory cell and architecture are disclosed. Each memory cell consists of 4 transistors configured to incorporate differential data storage (i.e., storing a true logic state and a complementary logic state), with each pair of transistors having a dual port configuration and forming one of a complementary pair of storage nodes for the memory cell. Each memory cell is coupled to 2 wordlines and 4 digit lines. Since the memory cell stores complementary data, and since a logic LOW state is rewritten to a given memory cell faster than a logic HIGH state is rewritten, the logic LOW state is rewritten and the complementary logic state is known to be a logic HIGH state. As a result, both the logic LOW and logic HIGH states are rewritten to the memory cell faster than independently writing a logic HIGH state.

20 Claims, 4 Drawing Sheets

DETAILED DESCRIPTION OF THE INVENTION

In the following detailed description, reference is made to the accompanying drawings which form a part hereof, and in which is shown by way of illustration specific embodiments in which the invention may be practiced. These embodiments are described in sufficient detail to enable those of ordinary skill in the art to make and use the invention, and it is to be understood that structural, logical or procedural changes may be made to the specific embodiments disclosed without departing from the spirit and scope of the present invention.

Figure 1:
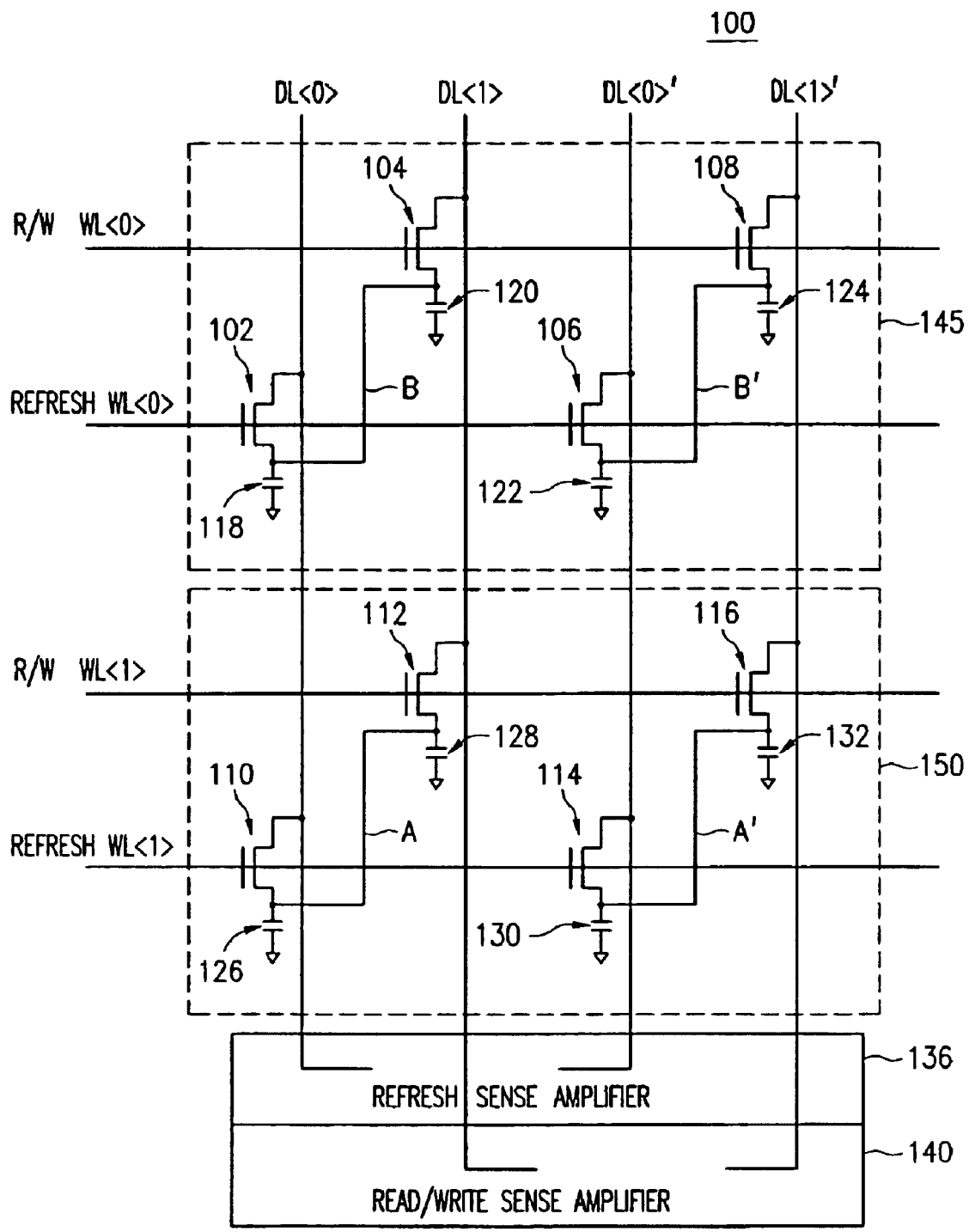

FIG. 1 depicts a simplified schematic diagram of a memory cell array 100 having two memory cells 145, 150 in accordance with an exemplary embodiment of the invention. The memory cell array consists of four digit lines DL<0>, DL<1>, DL<0>' and DL<1>' (depicted in the vertical direction) and four wordlines read/write wordline <0> (R/W WL<0>), refresh wordline <0> (Refresh WL<0>), R/W WL<1>, and Refresh WL<1> (depicted in the horizontal direction).

Turning first to memory cell 145, a first source/drain terminal of transistor 102 is coupled to DL<0>, a second source/drain terminal of transistor 102 is coupled to a first terminal of storage capacitor 118 and a gate of transistor 102 is coupled to Refresh WL<0>. A second terminal of storage capacitor 118 is coupled to ground (or some other static potential). A first source/drain terminal of transistor 104 is coupled to DL<1>, a second source/drain terminal of transistor 104 is coupled to a first terminal of storage capacitor 120 and a gate of transistor 104 is coupled to R/W WL<0>. A second terminal of storage capacitor 120 is coupled to ground (or some other static potential). Further, the second source/drain terminal of transistor 102 is coupled to the second source/drain terminal of transistor 104 and forms storage node B.

A first source/drain terminal of transistor 106 is coupled to DL<0>', a second source/drain terminal of transistor 106 is coupled to a first terminal of storage capacitor 122 and a gate of transistor 106 is coupled to Refresh WL<0>. A second terminal of storage capacitor 122 is coupled to ground (or some other static potential). A first source/drain terminal of transistor 108 is coupled to DL<1>', a second source/drain terminal of transistor 108 is coupled to a first terminal of storage capacitor 124 and a gate of transistor 108 is coupled to R/W WL<0>. A second terminal of storage capacitor 124 is coupled to ground (or some other static potential). Further, the second source/drain terminal of transistor 106 is coupled to the second source/drain terminal of transistor 108 and forms storage node B'. Storage node B' stores the complementary logic state of that stored by storage node B.

Still referring to FIG. 1, and turning now to memory cell 150, a first source/drain terminal of transistor 110 is coupled to DL<0>, a second source/drain terminal of transistor 110 is coupled to a first terminal of storage capacitor 126 and a gate of transistor 110 is coupled to Refresh WL<1>. A second terminal of storage capacitor 126 is coupled to ground (or some other static potential). A first source/drain terminal of transistor 112 is coupled to DL<1>, a second source/drain terminal of transistor 112 is coupled to a first terminal of storage capacitor 128 and a gate of transistor 112 is coupled to R/W WL<1>. A second terminal of storage capacitor 128 is coupled to ground (or some other static potential). Further, the second source/drain terminal of transistor 110 is coupled to the second source/drain terminal of transistor 112 and forms storage node A.

A first source/drain terminal of transistor 114 is coupled to DL<0>', a second source/drain terminal of transistor 114 is coupled to a first terminal of storage capacitor 130 and a gate of transistor 114 is coupled to Refresh WL<1>. A second terminal of storage capacitor 130 is coupled to ground (or some other static potential). A first source/drain terminal of transistor 116 is coupled to DL<1>', a second source/drain terminal of transistor 116 is coupled to a first terminal of storage capacitor 132 and a gate of transistor 116 is coupled to R/W WL<1>. A second terminal of storage capacitor 132 is coupled to ground (or some other static potential). Further, the second source/drain terminal of transistor 114 is coupled to the second source/drain terminal of transistor 116 and forms storage node A'. Storage node A' stores the complementary logic state of that stored by storage node A.

Digit lines DL<0> and DL<0>' are coupled to refresh sense amplifier 136 for detecting contents of the storage nodes during a scheduled refresh operation and for rewriting those contents to the proper storage node. Digit lines DL<1> and DL<1>' are coupled to read/write sense amplifier 140 for detecting contents of the storage nodes during a read operation and for writing back those contents once they are read. Further, for a write operation, read/write sense amplifier 140 controls the writing of a logic state to the storage nodes.

Still referring to FIG. 1, transistor pair 102 and 104 form a first dual port portion of memory cell 145 and transistor pair 106 and 108 form a second, complementary, dual port portion of memory cell 145. The first dual port portion of memory cell 145 forms storage node B. The second dual port portion of memory cell 145 forms storage node B'.

Transistor pair 110 and 112 form a first dual port portion of memory cell 150 and transistor pair 114 and 116 form a second dual port portion of memory cell 150. The first dual port portion of memory cell 150 forms storage node A. The second dual port portion of memory cell 150 forms storage node A'.

Figure 2:
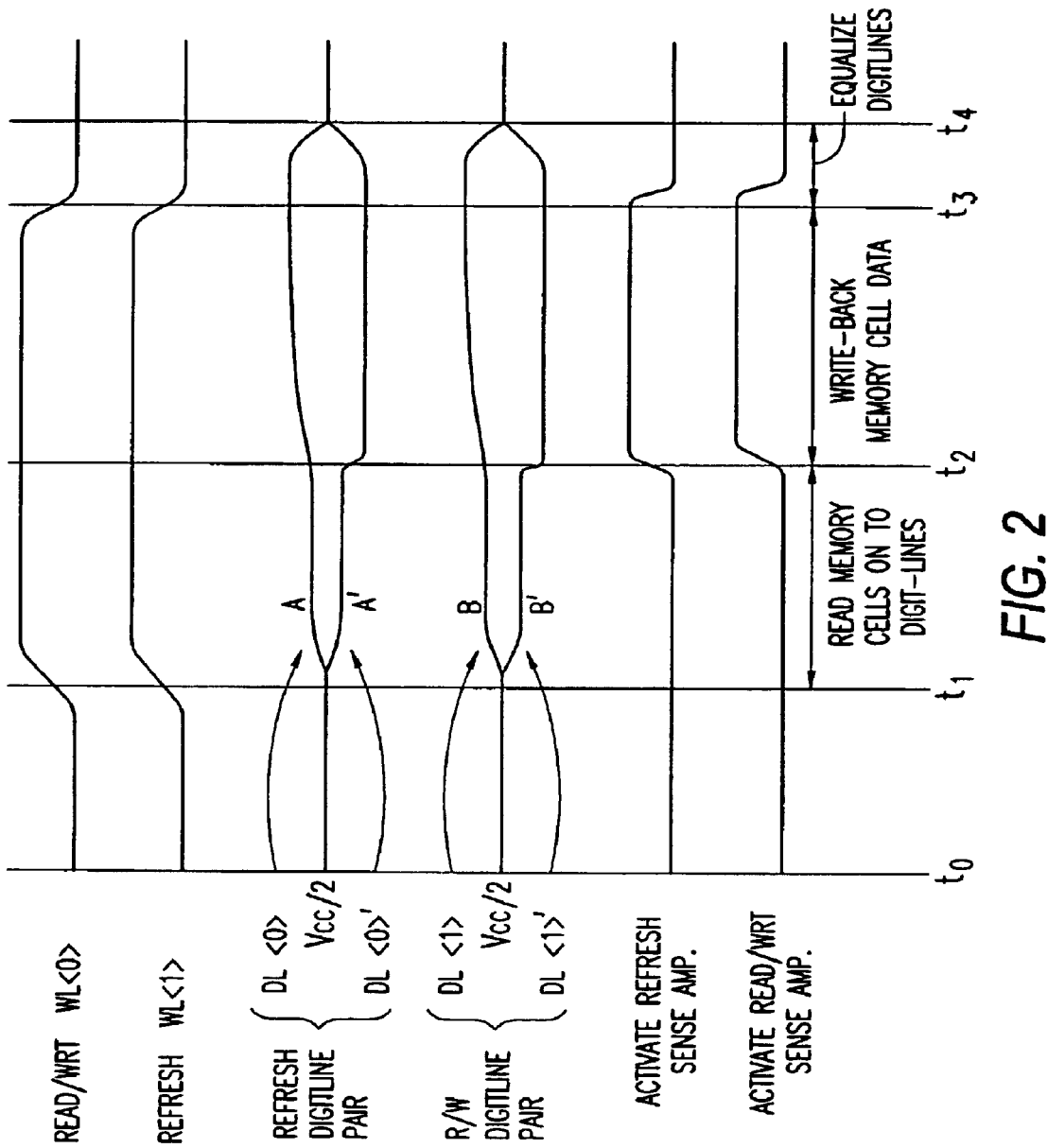
FIG. 2 depicts a timing diagram of the operation of the FIG. 1 memory cell array, in accordance with an exemplary embodiment of the invention.

Turning to FIG. 2, a timing diagram of the operation of the FIG. 1 memory cell array 100 is depicted in accordance with an exemplary embodiment of the invention. At time $t_0$, the digit lines DL<0>, DL<0>', DL<1> and DL<1>' are equilibrated to a predetermined initial voltage level (e.g., VCC/2). At time $t_1$, RW WL<0> goes logic HIGH (e.g., "1") signifying that a read/write operation is occurring at memory cell 145 and activates transistors 104 and 108. In addition, at $t_1$, Refresh WL<1> goes logic HIGH (e.g., "1") signifying that a refresh operation is occurring at memory cell 150 and activates transistors 110 and 114.

In accordance with an exemplary embodiment of the invention, the refresh operation acts in the background and is independent of any read/write operations being performed on the array 100. A read/write operation of one memory cell (e.g., memory cell 145) may occur simultaneously with a refresh operation of another memory cell (e.g., memory cell 150) in array 100. This is made possible by the independent digit lines for read/write and refresh operations. A read operation essentially performs a refresh since the contents of the memory cell must be rewritten once they are read. In the case of a conflict between a read/write operation and the hidden refresh operation (which operates to refresh data being stored in predetermined addresses in a predetermined sequence), the refresh operation is cancelled and the next address in the sequence is refreshed.

Still referring to FIG. 2, at time t1, the contents of storage nodes B, B', A and A' are respectively read by digit lines DL<1>, DL<1>', DL<0> and DL<0>'. For purposes of this description, it is assumed that storage nodes A and B are storing bits having a logic HIGH (e.g., "1") state. Therefore, storage nodes A' and B' are storing bits having a logic LOW (e.g., "0") state.

As can be seen at FIG. 2, at time $t_1$, the digit lines begin to detect a difference in voltage being stored by respective nodes. For example, digit line DL<0>, coupled to storage node A, begins to detect its voltage level rising from the equilibrated voltage level of e.g., VCC/2. For purposes of this description, it will be assumed that the equilibrated voltage level is 0.9V.

Continuing the example from above, digit line DL<0>', coupled to storage node A', begins to detect its voltage level dropping from the equilibrated voltage level of 0.9V. Since the voltage levels of digit lines DL<0> and DL<0>' are moving in opposite directions, owing to the complementary data states, it does not require much elapsed time before a determination can be made as to what logic state is being stored by each node.

Similarly, digit line DL<1>, coupled to storage node B, begins to detect its voltage level rising from the equilibrated voltage level of 0.9V and digit line DL<1>', coupled to storage node B', begins to detect its voltage level dropping from the equilibrated voltage level of 0.9V.

At time $t_2$, the refresh sense amplifier 136 and the R/W sense amplifier 140 are enabled. As a result, the respective differences between A and A', and B and B' are amplified and brought to corresponding rail levels. That is, the nodes detected as being above the equilibrated voltage level (e.g., nodes A and B), are driven to a first predetermined voltage level (e.g., VCC). For purposes of this description, VCC will be assumed to be 1.8V. The nodes detected as being below the equilibrated voltage level (e.g., nodes A' and B'), are driven to ground.

Also, at time $t_2$, the respective contents of nodes A, A', B and B' are written back to the memory cells 145, 150. In accordance with an exemplary embodiment of the invention, since n-channel pass transistors are used in the memory array 100, as depicted in FIG. 1, and since a logic LOW (e.g., "0") state is written to a given n-channel pass transistor/capacitor pair much more rapidly than a logic HIGH (e.g., "1") state is written to such a transistor/capacitor pair, the data can be rewritten back to the storage nodes faster than in the past by writing the logic LOW state at the same time as writing the logic HIGH state.

At time $t_3$, the wordlines are de-asserted. Then, at time $t_4$, the sense amplifiers are disabled and the digit lines are equilibrated back to their quiescent level (e.g., VCC/2, or 0.9V).

That is, in accordance with an exemplary embodiment of the invention, the data is considered as being rewritten to the storage nodes in the time it takes to write a logic LOW state to the appropriate node (e.g., nodes A' and B' in this example). Although the logic HIGH state will not have been "properly" rewritten back to the node in the same timeframe as did the logic LOW state, the "poorly" represented logic HIGH state is still distinguishable from the logic LOW state since it must be the complement of the node written to with a logic LOW state. That is, the logic state must be HIGH if the bit written to the complementary node is a logic LOW.

In accordance with an exemplary embodiment of the invention, approximately 0.5 nanoseconds are required in order to write a logic LOW state back into the node (i.e., dropping from the equilibrated voltage of 0.9V down to 0V). Under ordinary circumstances, writing a logic HIGH state requires approximately 8 nanoseconds to go from the equilibrated voltage level (e.g., 0.9V) up to a voltage level enabling a determination of a logic HIGH state (e.g., 1.9V). Here, a memory cell architecture and method are provided that allow both logic LOW and logic HIGH states to be rewritten to respective storage nodes in the same amount of time normally required to rewrite a logic LOW state (e.g., 0.5 nanoseconds). This is achieved by providing both a true logic state and a complementary logic state in two storage nodes of a memory cell.

In accordance with an exemplary embodiment of the invention, although the voltage level of the storage node storing the logic HIGH state (e.g., node A) cannot reach the level of VCC (e.g., 1.8V) in the allotted timeframe (e.g., 0.5 nanoseconds), and in fact, is more likely to be in the 1.1V–1.2V range, a logic HIGH state is nonetheless correctly detected. This is possible since the logic state being written to the storage node (e.g., node A) is the complement of the logic LOW state fully written to the other storage node (e.g., node A').

Figure 3:
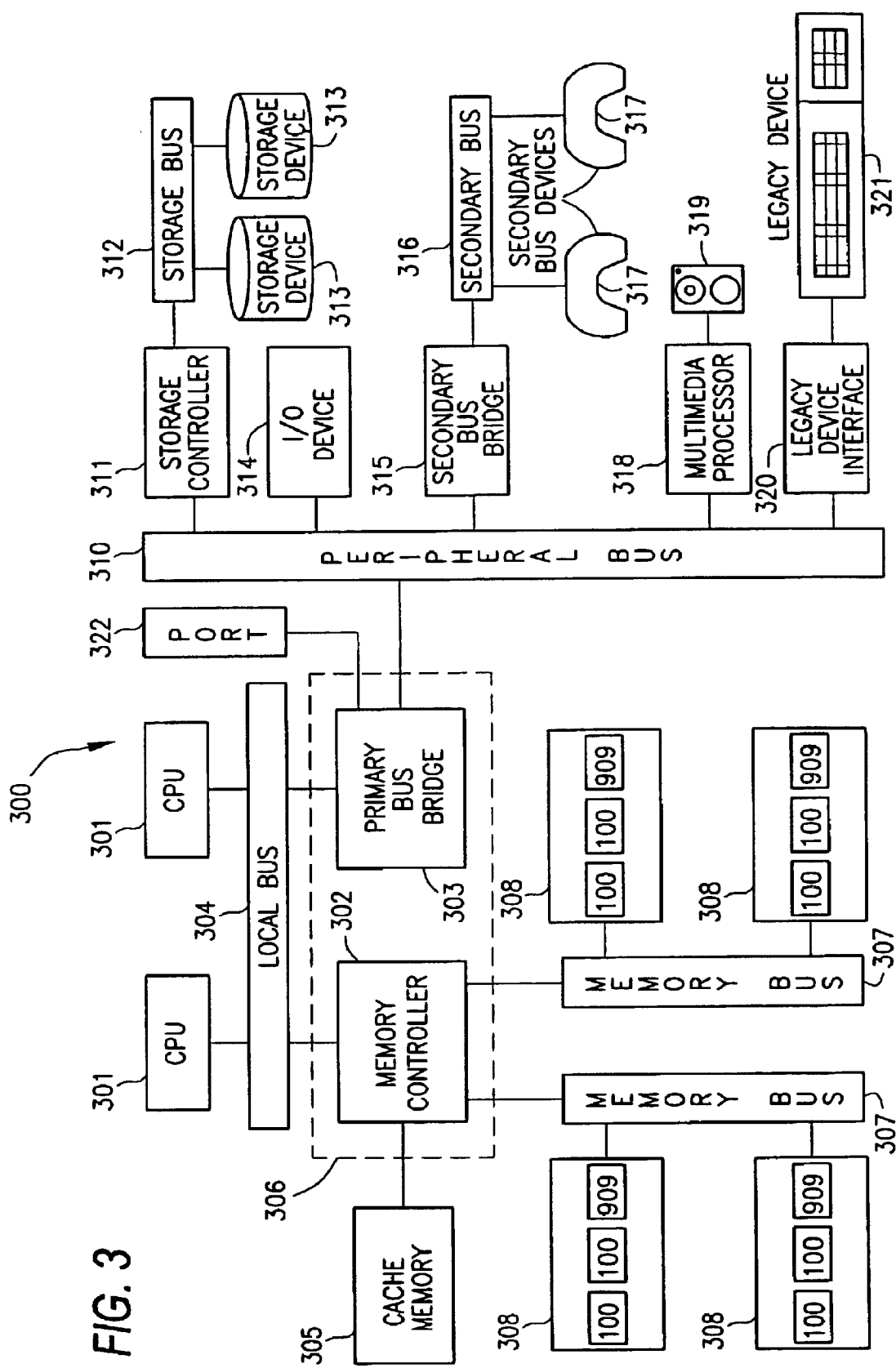
FIG. 3 depicts a processor system incorporating the memory cell array of FIG. 1.

Turning now to FIG. 3, an exemplary processing system 300 which may utilize the high-speed transparent refresh DRAM-based memory array 100 of the present invention is depicted. The processing system 300 includes one or more processors 301 coupled to a local bus 304. A memory controller 302 and a primary bus bridge 303 are also coupled to the local bus 304. The processing system 300 may include multiple memory controllers 302 and/or multiple primary bus bridges 303. The memory controller 302 and the primary bus bridge 303 may be integrated as a single device 306.

The memory controller 302 is also coupled to one or more memory buses 307. Each memory bus accepts memory components 308 which include at least one high-speed transparent refresh DRAM-based memory array 100 of the present invention. The memory components 308 may be a memory card or a memory module. Examples of memory modules include single inline memory modules (SIMMs) and dual inline memory modules (DIMMs). The memory components 308 may include one or more additional devices 309. For example, in a SIMM or DIMM, the additional device 309 might be a configuration memory, such as a serial presence detect (SPD) memory. The memory controller 302 may also be coupled to a cache memory 305. The cache memory 305 may be the only cache memory in the processing system. Alternatively, other devices, for example, processors 301 may also include cache memories, which may form a cache hierarchy with cache memory 305. If the processing system 300 include peripherals or controllers which are bus masters or which support direct memory access (DMA), the memory controller 302 may implement a cache coherency protocol. If the memory controller 302 is coupled to a plurality of memory buses 307, each memory bus 307 may be operated in parallel, or different address ranges may be mapped to different memory buses 307.

The primary bus bridge 303 is coupled to at least one peripheral bus 310. Various devices, such as peripherals or additional bus bridges may be coupled to the peripheral bus 310. These devices may include a storage controller 311, a miscellaneous I/O device 314, a secondary bus bridge 315, a multimedia processor 318, and a legacy device interface 320. The primary bus bridge 303 may also coupled to one or more special purpose high speed ports 322. In a personal computer, for example, the special purpose port might be the Accelerated Graphics Port (AGP), used to couple a high performance video card to the processing system 300.

The storage controller 311 couples one or more storage devices 313, via a storage bus 312, to the peripheral bus 310. For example, the storage controller 311 may be a SCSI controller and storage devices 313 may be SCSI discs. The I/O device 314 may be any sort of peripheral. For example, the I/O device 314 may be a local area network interface, such as an Ethernet card. The secondary bus bridge may be used to interface additional devices via another bus to the processing system. For example, the secondary bus bridge may be an universal serial port (USB) controller used to couple USB devices 317 to the processing system 300. The multimedia processor 318 may be a sound card, a video capture card, or any other type of media interface, which may also be coupled to one additional devices such as speakers 319. The legacy device interface 320 is used to couple legacy devices, for example, older styled keyboards and mice, to the processing system 300.

The processing system 300 illustrated in FIG. 3 is only an exemplary processing system with which the invention may be used. While FIG. 3 illustrates a processing architecture especially suitable for a general purpose computer, such as a personal computer or a workstation, it should be recognized that well known modifications can be made to configure the processing system 300 to become more suitable for use in a variety of applications. For example, many electronic devices which require processing may be implemented using a simpler architecture which relies on a CPU 301 coupled to memory components 308 and/or the high-speed transparent refresh DRAM-based memory array 100. These electronic devices may include, but are not limited to audio/video processors and recorders, gaming consoles, digital television sets, wired or wireless telephones, navigation devices (including system based on the global positioning system (GPS) and/or inertial navigation), and digital cameras and/or recorders. The modifications may include, for example, elimination of unnecessary components, addition of specialized devices or circuits, and/or integration of a plurality of devices.

Figure 4:
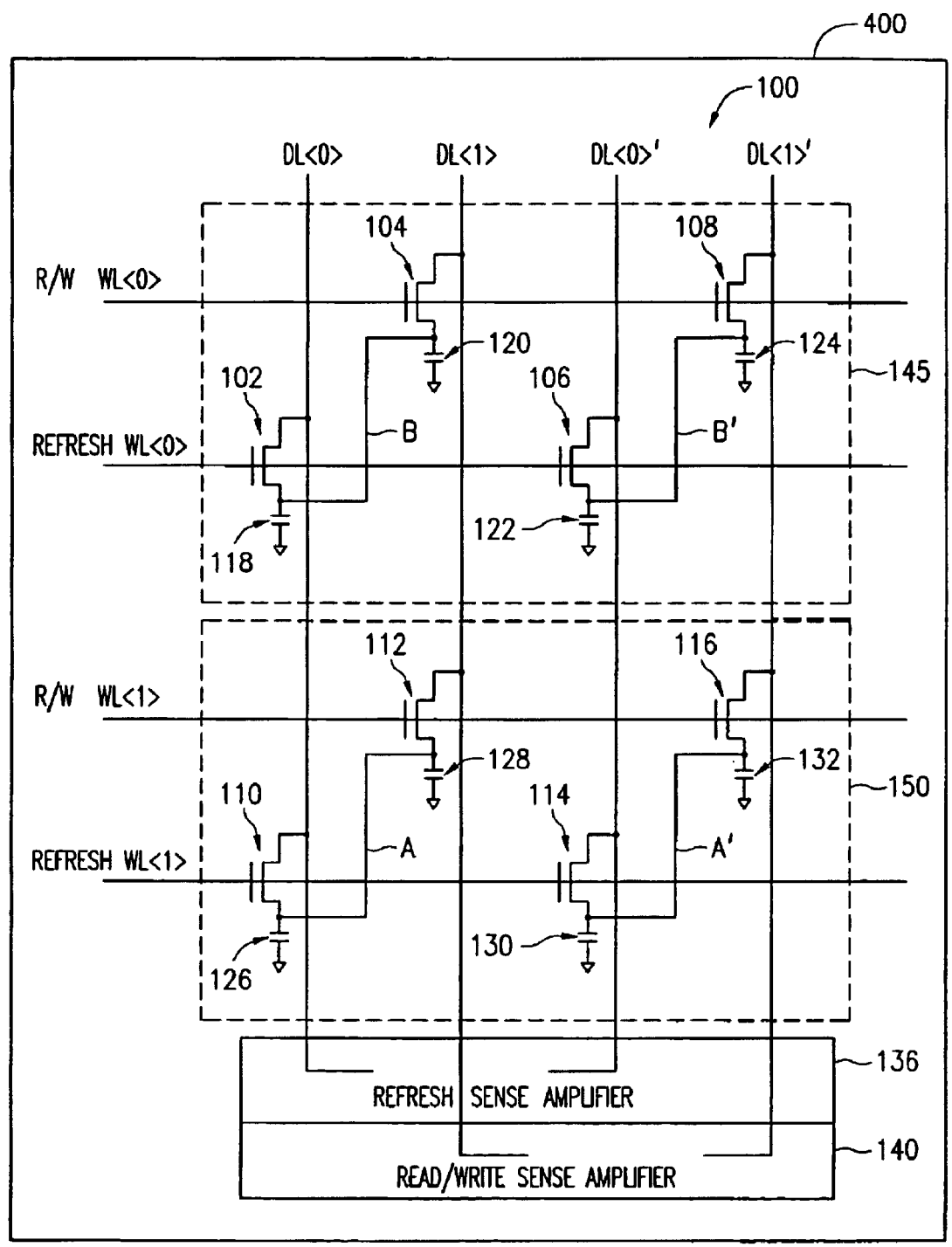
FIG. 4 depicts the FIG. 1 memory cell array on a semiconductor chip.

FIG. 4 depicts the memory cell array 100 of FIG. 1 situated on a semiconductor memory chip 400 so that it may be incorporated into a processor system such as the one depicted in FIG. 3.

It is desirable to have a high-speed transparent refresh DRAM-based memory cell (e.g., 145 of FIG. 1) that operates at speeds normally associated with 6 transistor SRAM technology and that lends itself to the relatively low manufacturing costs associated with DRAM technology. The present invention accomplishes this by providing a memory cell architecture consisting of 4 transistors (e.g., 102–108) configured to incorporate differential data storage (i.e., storing a true logic state and a complementary logic state), with each pair of transistors having a dual port configuration and forming one of a complementary pair of storage nodes (e.g., B and B'). Each memory cell 145 is coupled to 2 wordlines (e.g., R/W WL<0>, Refresh WL<0>) and 4 digit lines (e.g., DL<0>, DL<1>, DL<0>', DL<1>'). Since the memory cell 145 stores complementary data (B, B'), and since a logic LOW state (e.g., "0") is rewritten to a given memory cell faster than a logic HIGH state (e.g.,"1") is rewritten, the logic LOW state is rewritten and the logic HIGH state is distinguishable from the logic LOW state since they are complementary states. As a result, both the logic LOW and the logic HIGH states are rewritten to the memory cell 145 faster than a logic HIGH state could be independently rewritten. Since the refresh is hidden, an exemplary application for the invention is use as a replacement for 6 transistor fast SRAM technology.

While the invention has been described in detail in connection with preferred embodiments known at the time, it should be readily understood that the invention is not limited to the disclosed embodiments. Rather, the invention can be modified to incorporate any number of variations, alterations, substitutions or equivalent arrangements not heretofore described, but which are commensurate with the spirit and scope of the invention. For example, although an exemplary embodiment of the invention has been described in connection with only 2 memory cells, 145, 150 in memory cell array 100, it should be readily apparent that any number of memory cells may be incorporated into memory cell array 100. In addition, although an exemplary embodiment of the invention depicts 2 storage capacitors (e.g., 118, 120) for each dual port transistor configuration (e.g., transistors 102 and 104), it should be readily apparent that each pair of transistors forming a storage node may share one storage capacitor.

Further, although an exemplary embodiment of the invention has been described in connection with referencing a rewrite of a logic HIGH state with a voltage level associated with a logic LOW state, rather than a reference voltage level, it should be readily understood that the reverse can be achieved through the use of p-channel pass transistors. That is, if p-channel pass transistors were to replace transistors 102–116, a logic HIGH state could be rewritten back into the memory cell faster than a logic LOW state could be rewritten. Therefore, the rewrite of the logic LOW state could then be referenced to the logic HIGH state, rather then a reference voltage level.

Moreover, while the operation of the FIG. 1 memory cell array 100 is described in connection with the FIG. 2 timing diagram, it should be readily understood that the specific logic states described in connection with FIG. 2 can easily be reversed and/or otherwise modified. Accordingly, the invention is not limited by the foregoing description or drawings, but is only limited by the scope of the appended claims.

What is claimed as new and desired to be protected by Letters Patent of the United States is:

1. A memory cell comprising:
   a first storage node formed of a first transistor coupled to a second transistor, a first source/drain terminal of said first transistor coupled to a first digit line, a first source drain terminal of said second transistor coupled to a second digit line; and
   a second storage node formed of a third transistor coupled to a fourth transistor, a first source/drain terminal of said third transistor coupled to a third digit line, a first source drain terminal of said fourth transistor coupled to a fourth digit line, wherein
   said first storage node stores a true logic state of a stored bit, and wherein
   said second storage node stores a complementary logic state of said stored bit.

2. The memory cell of claim 1 further comprising:
   a first terminal of a storage capacitor coupled to a second source/drain terminal of said first transistor;
   a first terminal of a second storage capacitor coupled to a second source/drain terminal of said second transistor, said first and second storage capacitors being electrically connected and forming said first storage node;
   a first terminal of a third storage capacitor coupled to a second source/drain terminal of said third transistor; and
   a first terminal of a fourth storage capacitor coupled to a second source/drain terminal of said fourth transistor, said third and fourth storage capacitors being electrically connected and forming said second storage node.

3. The memory cell of claim 2 further comprising respective second terminals of said first through fourth storage capacitors being coupled to ground.

4. The memory cell of claim 1 further comprising:
   a gate of said first and third transistor coupled to a first wordline enabling one of a read and write operation;
   a gate of said second and fourth transistor coupled to a second wordline enabling a refresh operation.

5. The memory cell of claim 1 further comprising:
   a refresh sense amplifier coupled to said first and third digit lines; and
   a read/write sense amplifier coupled to said second and fourth digit lines.

6. A memory cell, comprising:
   a first storage node switchably coupled to first and second digit lines; and
   a second storage node switchably coupled to third and fourth digit lines, wherein
   said first storage node stores one of a true logic state and a complementary logic state of a stored bit, and wherein
   said second storage node stores the other of said true logic state and said complementary logic state of said stored bit.

7. The memory cell of claim 6 further comprising:
   a first transistor switchably coupling said first storage node to said first digit line;
   a second transistor switchably coupling said first storage node to said second digit line;
   a third transistor switchably coupling said second storage node to said third digit line; and
   a fourth transistor switchably coupling said second storage node to said fourth digit line.

8. The memory cell of claim 7, wherein
   a gate of said first and third transistor is coupled to a first wordline for enabling a refresh operation of said first storage node; and
   a gate of said second and fourth transistor is coupled to a second wordline for enabling a read/write operation of said first storage node.

9. A memory cell, comprising:
   a first storage node for storing a true logic state of a stored bit; and
   a second storage node for storing a complementary logic state of said stored bit, wherein
   one of said true and complementary logic states is rewritten to said memory cell faster than the other of said true and complementary logic states, and wherein
   said true and complementary logic states are rewritten to said memory cell upon completion of rewriting said one logic state.

10. The memory cell of claim 9 further comprising:
    a first transistor switchably coupling said first storage node to a first digit line, said first digit line being coupled to a first sense amplifier;

a second transistor switchably coupling said first storage node to a second digit line, said second digit line being coupled to a second sense amplifier;

a third transistor switchably coupling said second storage node to a third digit line, said third digit line being coupled to said first sense amplifier; and a fourth transistor switchably coupling said second storage node to a fourth digit line, said fourth digit line being coupled to said second sense amplifier.

11. The memory cell of claim 10, wherein said first sense amplifier is a refresh sense amplifier and said second sense amplifier is a read/write sense amplifier.

12. The memory cell of claim 10, wherein said first sense amplifier is a read/write sense amplifier and said second sense amplifier is a refresh sense amplifier.

13. The memory cell of claim 10 further comprising:

a first wordline enabling read/write operations coupled to a gate of both said second and fourth transistors; and a second wordline enabling refresh operations coupled to a gate of both said first and third transistors.

14. The memory cell of claim 10 further comprising:

a first wordline enabling refresh operations coupled to a gate of both said second and fourth transistors; and a second wordline enabling read/write operations coupled to a gate of both said first and third transistors.

15. A semiconductor memory chip, comprising:

a plurality of memory cells, each of said memory cells comprising:

a first storage node formed of a first transistor coupled to a second transistor, a first source/drain terminal of said first transistor coupled to a first digit line, a first source drain terminal of said second transistor coupled to a second digit line; and a second storage node formed of a third transistor coupled to a fourth transistor, a first source/drain terminal of said third transistor coupled to a third digit line, a first source drain terminal of said fourth transistor coupled to a fourth digit line, wherein said first storage node stores a true logic state of a stored bit, and wherein said second storage node stores a complementary logic state of said stored bit.

16. The chip of claim 15, wherein each memory cell further comprises:

a first terminal of a storage capacitor coupled to a first source/drain terminal of said first transistor;

a first terminal of a second storage capacitor coupled to a first source/drain terminal of said second transistor, said first and second storage capacitors forming said first storage node;

a first terminal of a third storage capacitor coupled to a first source/drain terminal of said third transistor; and a first terminal of a fourth storage capacitor coupled to a first source/drain terminal of said fourth transistor, said third and fourth storage capacitors forming said second storage node.

17. The chip of claim 15, each of said memory cells further comprising:

a gate of said first and third transistor coupled to a first wordline enabling one of a read and write operation; and a gate of said second and fourth transistor coupled to a second wordline enabling a refresh operation.

18. The chip of claim 15, each of said memory cells further comprising:

a refresh sense amplifier coupled to said first and third digit lines; and a read/write sense amplifier coupled to said second and fourth digit lines.

19. The chip of claim 16, wherein each memory cell further comprises respective second terminals of said first through fourth storage capacitors being coupled to ground.

20. A semiconductor memory chip, comprising:

a plurality of memory cells, each of said memory cells comprising:

a first storage node formed of a first transistor coupled to a second transistor, a first source/drain terminal of said first transistor coupled to a first digit line, a first source drain terminal of said second transistor coupled to a second digit line;

a second storage node formed of a third transistor coupled to a fourth transistor, a first source/drain terminal of said third transistor coupled to a third digit line, a first source drain terminal of said fourth transistor coupled to a fourth digit line, wherein said first storage node stores a true logic state of a stored bit, and wherein said second storage node stores a complementary logic state of said stored bit;

a first terminal of a storage capacitor coupled to a second source/drain terminal of said first transistor;

a first terminal of a second storage capacitor coupled to a second source/drain terminal of said second transistor, said first and second storage capacitors being electrically connected and forming said first storage node;

a first terminal of a third storage capacitor coupled to a second source/drain terminal of said third transistor;

a first terminal of a fourth storage capacitor coupled to a second source/drain terminal of said fourth transistor, said third and fourth storage capacitors being electrically connected and forming said second storage node;

a gate of said first and third transistor coupled to a first wordline enabling one of a read and write operation;

a gate of said second and fourth transistor coupled to a second wordline enabling a refresh operation;

a refresh sense amplifier coupled to said first and third digit lines; and a read/write sense amplifier coupled to said second and fourth digit lines.

* * * * *